(12) United States Patent
Kishimoto et al.

(10) Patent No.: US 10,469,054 B2
(45) Date of Patent: Nov. 5, 2019

(54) PIEZOELECTRIC MODULE

(71) Applicant: Murata Manufacturing Co., Ltd., Nagaokakyo-shi, Kyoto-fu (JP)

(72) Inventors: Yutaka Kishimoto, Nagaokakyo (JP); Yasuyuki Ida, Nagaokakyo (JP); Hideaki Kobayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 344 days.

(21) Appl. No.: 15/465,630

(22) Filed: Mar. 22, 2017

(65) Prior Publication Data

US 2017/0194933 A1    Jul. 6, 2017

Related U.S. Application Data

(63) Continuation of application No. PCT/JP2015/079765, filed on Oct. 22, 2015.

(30) Foreign Application Priority Data

Oct. 29, 2014 (JP) ................................. 2014-220509

(51) Int. Cl.
*H03H 9/17* (2006.01)
*H03H 3/02* (2006.01)
*H03H 9/02* (2006.01)
*H03H 9/05* (2006.01)

(52) U.S. Cl.
CPC .............. *H03H 9/173* (2013.01); *H03H 3/02* (2013.01); *H03H 9/02228* (2013.01); *H03H 9/0547* (2013.01); *H03H 9/175* (2013.01)

(58) Field of Classification Search
CPC combination set(s) only.
See application file for complete search history.

(56) References Cited

U.S. PATENT DOCUMENTS

| 6,466,124 B1 | 10/2002 | Shibuya et al. |
| 7,336,017 B2 * | 2/2008 | Lee .......................... H01L 24/97 |
| | | 310/313 R |
| 8,004,160 B2 * | 8/2011 | Tsuda ...................... H03H 9/059 |
| | | 310/313 R |

(Continued)

FOREIGN PATENT DOCUMENTS

| JP | 63-187713 A | 8/1988 |
| JP | 2000-294738 A | 10/2000 |

(Continued)

OTHER PUBLICATIONS

English Translation of JP 2005311511, Kazuhide (Year: 2005).*

(Continued)

*Primary Examiner* — Bryan P Gordon
(74) *Attorney, Agent, or Firm* — Keating & Bennett, LLP (57) ABSTRACT

A piezoelectric module includes a piezoelectric thin film, a fixing layer, and a support substrate. The piezoelectric thin film is supported by the support substrate with the fixing layer in between. Functional conductors are provided on a surface of the piezoelectric thin film. A void is provided in the fixing layer to include a region overlapping with the functional conductors. A conductor pattern defining a circuit element is provided in a region of the void on a surface of the support substrate on the fixing layer side.

18 Claims, 8 Drawing Sheets

(56) References Cited

U.S. PATENT DOCUMENTS

| | | | | |
|---|---|---|---|---|
| 2007/0013268 | A1* | 1/2007 | Kubo | H03H 3/02 |
| | | | | 310/324 |
| 2007/0058003 | A1* | 3/2007 | Aoki | H03H 9/0547 |
| | | | | 347/68 |
| 2007/0093229 | A1 | 4/2007 | Yamakawa et al. | |
| 2007/0284966 | A1* | 12/2007 | Kadota | G01N 29/022 |
| | | | | 310/313 R |
| 2011/0266918 | A1* | 11/2011 | Iwamoto | H03H 3/08 |
| | | | | 310/313 B |
| 2013/0342285 | A1 | 12/2013 | Kadota et al. | |
| 2014/0118090 | A1* | 5/2014 | Grannen | H03H 9/02047 |
| | | | | 333/187 |
| 2015/0221442 | A1 | 8/2015 | Link et al. | |
| 2017/0077900 | A1* | 3/2017 | Park | H03H 9/706 |

FOREIGN PATENT DOCUMENTS

| | | |
|---|---|---|
| JP | 2005-286658 A | 10/2005 |
| JP | 2005-311511 A | 11/2005 |
| JP | 2007-143127 A | 6/2007 |
| JP | 2007-181147 A | 7/2007 |
| JP | 2007-214782 A | 8/2007 |
| JP | 2008-154240 A | 7/2008 |
| JP | 2008-160654 A | 7/2008 |
| JP | 2010-093398 A | 4/2010 |
| KR | 10-2007-0031245 A | 3/2007 |
| WO | 2012/114931 A1 | 8/2012 |
| WO | 2014/032907 A1 | 3/2014 |

OTHER PUBLICATIONS

Official Communication issued in corresponding Korean Patent Application No. 10-2017-7010218, dated Mar. 15, 2018.

Official Communication issued in International Patent Application No. PCT/JP2015/079765, dated Dec. 15, 2015.

* cited by examiner

FIG. 15

PIEZOELECTRIC MODULE

CROSS REFERENCE TO RELATED APPLICATIONS

This application claims the benefit of priority to Japanese Patent Application No. 2014-220509 filed on Oct. 29, 2014 and is a Continuation Application of PCT Application No. PCT/JP2015/079765 filed on Oct. 22, 2015. The entire contents of each application are hereby incorporated herein by reference.

BACKGROUND OF THE INVENTION

1. Field of the Invention

The present invention relates to a piezoelectric module, and more specifically to a piezoelectric module including a piezoelectric resonator and another circuit element.

2. Description of the Related Art

Various types of filters using a piezoelectric resonator are known. In a piezoelectric module such as a filter including a piezoelectric resonator, the piezoelectric resonator and another circuit element may be integrally configured. Examples of the above another circuit element include an inductor, a capacitor, or the like configuring a matching circuit for the piezoelectric resonator.

Japanese Unexamined Patent Application Publication No. 2010-93398 describes a filter in which a piezoelectric resonator and a capacitor are formed on a surface of a substrate. However, in the configuration of the filter described in Japanese Unexamined Patent Application Publication No. 2010-93398, a circuit element is formed on the surface of the substrate, thus the circuit element has low weather resistance, and it is necessary to further add a structure which improves the weather resistance.

SUMMARY OF THE INVENTION

Accordingly, preferred embodiments of the present invention provide piezoelectric modules with high reliability, in which weather resistance of a circuit element is improved.

A piezoelectric module according to a preferred embodiment of the present invention includes a piezoelectric thin film on which a functional conductor is provided, a support substrate, a fixing layer fixing the piezoelectric thin film to the support substrate, and a circuit element between the piezoelectric thin film and the support substrate.

According to this configuration, weather resistance of the circuit element is improved without further providing a protection member.

Additionally, in a piezoelectric module according to a preferred embodiment of the present invention, it is preferable that the circuit element be defined by a conductor pattern which is provided on the piezoelectric thin film or the support substrate.

According to this configuration, the circuit element is provided without using a mounting component. Accordingly, a structure in which the mounting component is mounted to the piezoelectric thin film or the support substrate need not be used, and thus occurrence of failure due to the mounting structure is able to be significantly reduced or prevented.

Additionally, in a piezoelectric module according to a preferred embodiment of the present invention, when viewed in a direction perpendicular or substantially perpendicular to a surface of the piezoelectric thin film on which a resonator electrode is provided, the fixing layer may include a void having a shape including a region in which the functional conductor is provided.

According to this configuration, characteristics of a piezoelectric resonator are improved. Accordingly, the piezoelectric module with high reliability and superior characteristics are able to be obtained.

Additionally, in a piezoelectric module according to a preferred embodiment of the present invention, it is preferable that the conductor pattern overlap with the void.

According to this configuration, the circuit element and the piezoelectric resonator are close to each other, or at least partially overlap. Accordingly, the piezoelectric module is able to be formed smaller in size.

Additionally, in a piezoelectric module according to preferred embodiment of the present invention, it is preferable that a region in which the conductor pattern is provided overlaps with the region in which the functional conductor is provided.

According to this configuration, the piezoelectric module is able to be made even smaller in size.

Additionally, in a piezoelectric module according to a preferred embodiments of the present invention, the region in which the conductor pattern is provided preferably entirely overlaps with the region in which the functional conductor is provided.

According to this configuration, the piezoelectric module is able to be made even smaller in size.

Additionally, in a piezoelectric module according to a preferred embodiment of the present invention, the fixing layer may be an acoustic reflection layer including plural types of layers that have different acoustic impedances and are laminated.

According to this configuration as well, the weather resistance of the circuit element is improved, and the piezoelectric module with high reliability is able to be obtained.

According to the above features of preferred embodiments of the present invention, piezoelectric modules with high reliability, in which weather resistance of a circuit element is improved, are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
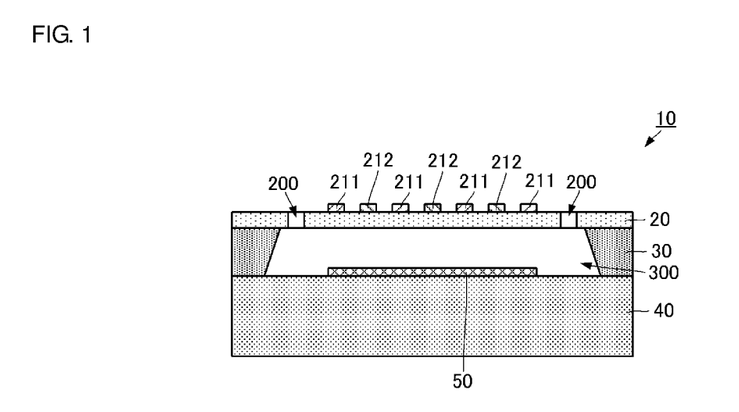
FIG. 1 is a side sectional view illustrating the configuration of a piezoelectric module according to a first preferred embodiment of the present invention.
Figure 2A:
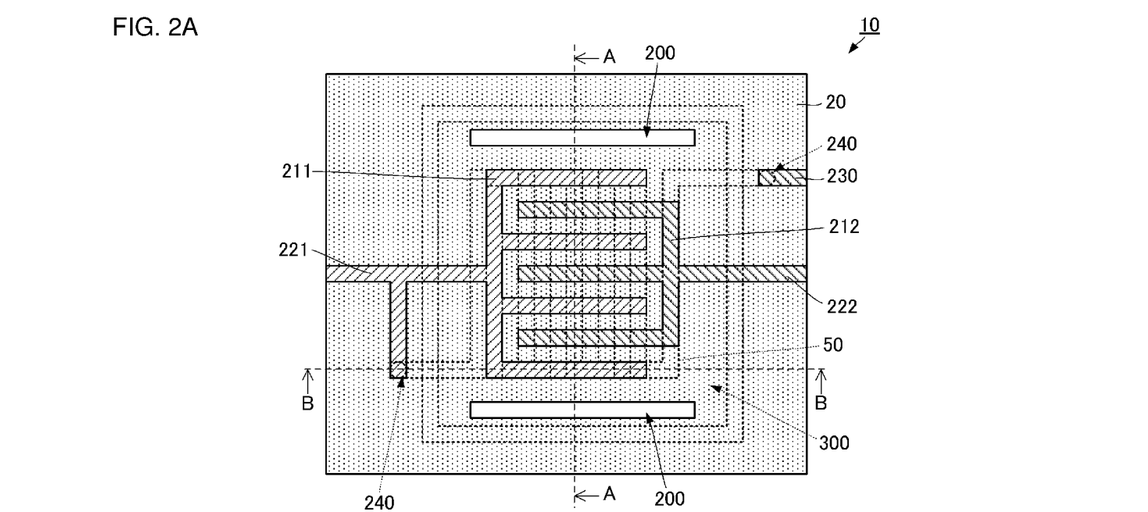
FIGS. 2A and 2B are plan views of a surface on which functional conductors are provided and a surface on which a circuit element is provided, of the piezoelectric module according to the first preferred embodiment of the present invention.
Figure 2B:
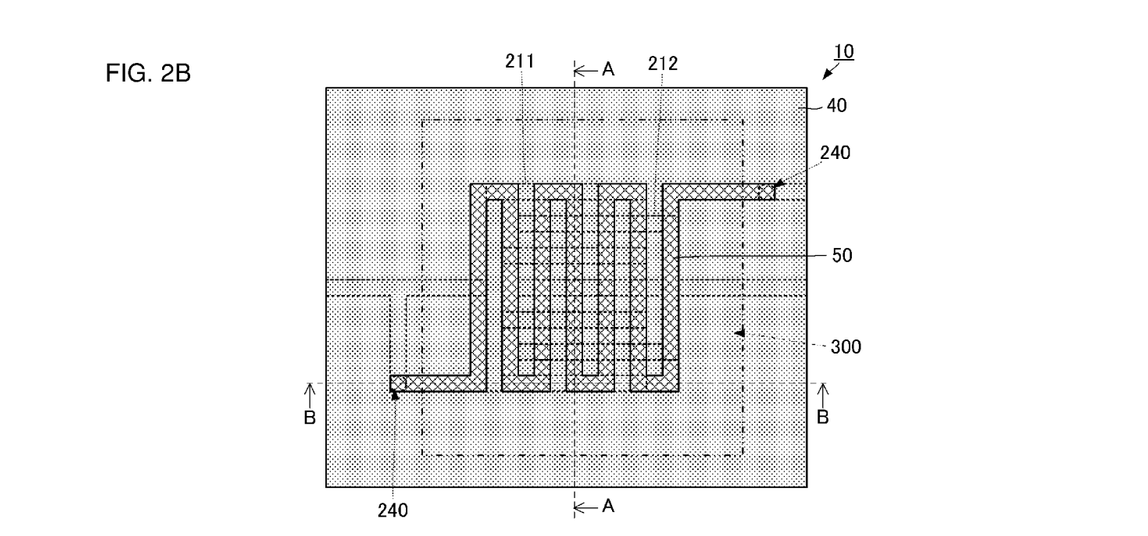
Figure 3:
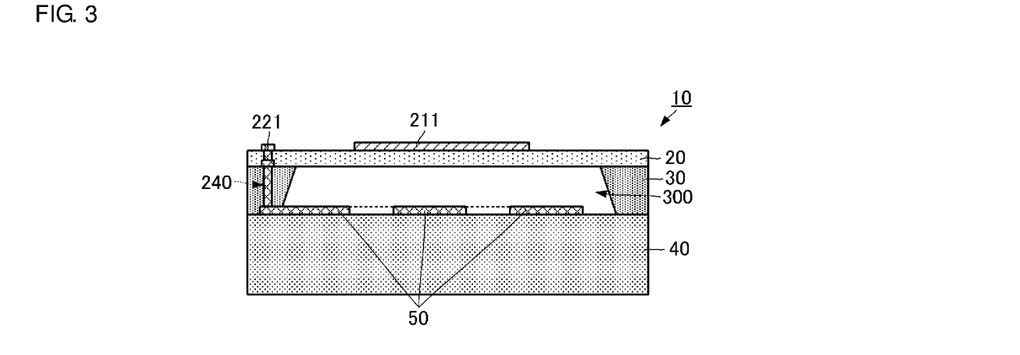
FIG. 3 is a sectional view illustrating the configuration of an interlayer wiring of the piezoelectric module according to the first preferred embodiment of the present invention.

Piezoelectric modules according to preferred embodiments of the present invention will be described with reference to the drawings. FIG. 1 is a side sectional view illustrating the configuration of a piezoelectric module according to a first preferred embodiment of the present invention (corresponding to a sectional view taken along a line A-A in FIG. 2). FIG. 2A is a plan view of a surface, on which functional conductors are provided, of the piezoelectric module according to the first preferred embodiment of the present invention. FIG. 2B is a plan view of a surface, on which a circuit element is provided, of the piezoelectric module according to the first preferred embodiment of the present invention. FIG. 3 is a sectional view illustrating the configuration of an interlayer wiring of the piezoelectric module according to the first preferred embodiment of the present invention (corresponding to a sectional view taken along a line B-B in FIGS. 2A and 2B).

A piezoelectric module 10 preferably includes a piezoelectric thin film 20, a fixing layer 30, and a support substrate 40. The fixing layer 30 is bonded to a rear surface of the piezoelectric thin film 20, the support substrate 40 is bonded to a rear surface of the fixing layer 30 (a surface on an opposite side to a surface with which the piezoelectric thin film 20 is in contact). According to this configuration, the piezoelectric thin film 20 is supported by the support substrate 40 with the fixing layer 30 in between.

The piezoelectric thin film 20 is preferably made of a piezoelectric material such as LN ($LiNbO_3$), LT ($LiTaO_3$), or the like, for example. The fixing layer 30 is an electrical insulator such as $SiO_2$ or the like, for example. The support substrate 40 is preferably made of Si, sapphire, glass, or the like, for example.

On a surface of the piezoelectric thin film 20 (a surface on an opposite side to a surface on the fixing layer 30 side), functional conductors 211 and 212 are provided. The functional conductors 211 and 212 preferably have comb-teeth shapes in plan view. The functional conductors 211 and 212 define a so-called interdigital transducer (IDT). According to this configuration, a piezoelectric resonator is provided.

Wiring conductors 221 and 222 are preferably provided on the surface of the piezoelectric thin film 20. The wiring conductor 221 is electrically connected to the functional conductor 211. The wiring conductor 222 is electrically connected to the functional conductor 212. The wiring conductors 221 and 222 are conductors connecting the functional conductors 211 and 212, respectively, to an external circuit. The functional conductors 211 and 212 and the wiring conductors 221 and 222 are made of a material having high electrical conductivity such as Al or the like, for example.

A void 300 is provided in the fixing layer 30. The void 300 is surrounded by the piezoelectric thin film 20, the fixing layer 30, and the support substrate 40. Note that, the void 300 is communicated to an outside of the piezoelectric module 10 by through-holes 200 provided in the piezoelectric thin film 20. The through-holes 200 are used when the void 300 is provided. Further, the through-holes 200 may be defined by elongated slots which extend laterality in the piezoelectric thin film.

On a surface of the support substrate 40 (the fixing layer 30 side), a conductor pattern 50 is provided. Both ends of the conductor pattern 50 are preferably routed conductors, and a portion of the conductor pattern 50 between the routed conductors at both ends has a meandering or serpentine shape. According to this configuration, the conductor pattern 50 defines and functions as an inductor. The conductor pattern 50 is preferably made of a material similar to the material of the functional conductors 211 and 212 and the wiring conductors 221 and 222.

The portion of the conductor pattern 50 including the meandering or serpentine shape is located within a region of the void 300 in plan view. Furthermore, the portion of the conductor pattern 50 including the meandering or serpentine shape overlaps with the interdigital transducer region defined by the functional conductors 211 and 212.

Both the ends of the conductor pattern 50 are electrically connected to the wiring conductors 221 and 222 by conductive via holes 240 passing through the fixing layer 30 and the piezoelectric thin film 20 in a thickness direction.

With such a configuration, the inductor which is the circuit element connected to the piezoelectric resonator is not exposed to the outside. Accordingly, weather resistance of the inductor is able to be improved.

Additionally, with such a configuration, the inductor and the piezoelectric resonator overlap in plan view. Accordingly, a resonance circuit defined by the piezoelectric resonator and a peripheral circuit element connected to the piezoelectric resonator is able to be made smaller in size. Furthermore, with such a configuration, the inductor and the piezoelectric resonator almost entirely overlap with each other. Accordingly, the resonance circuit defined by the piezoelectric resonator and the peripheral circuit element connected to the piezoelectric resonator is able to be made even smaller in size.

Furthermore, according to the configuration of the present preferred embodiment, the conductor pattern 50 defining the inductor and the piezoelectric resonator are spaced from each other with the void 300 in between, and thus mutual interference between the conductor pattern 50 defining the inductor and the piezoelectric resonator is able to be significantly reduced or prevented.

The piezoelectric module 10 having such a configuration is formed preferably through processes described below, for example. FIGS. 4A-4D and FIGS. 5A-5C are side sectional views illustrating shapes in respective processes in a method for manufacturing the piezoelectric module according to the first preferred embodiment of the present invention.

Figure 4A:
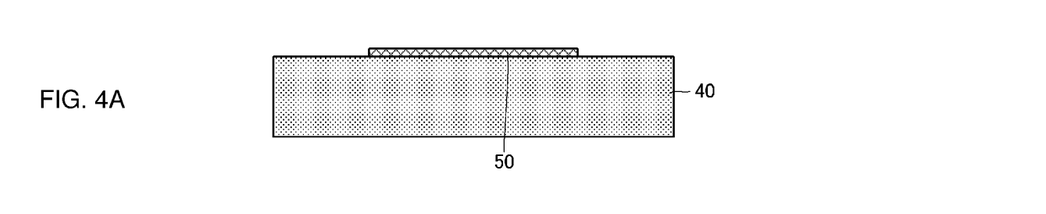
FIGS. 4A-4D are side sectional views illustrating shapes in respective processes in a method for manufacturing the piezoelectric module according to the first preferred embodiment of the present invention.
Figure 4B:
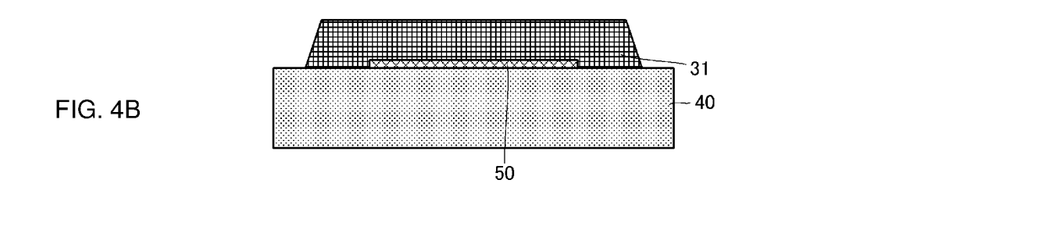

As illustrated in FIG. 4A, the conductor pattern 50 is formed on the surface of the support substrate 40. Next, as illustrated in FIG. 4B, a sacrificial layer 31 is formed on the surface of the support substrate 40. The sacrificial layer 31 is preferably made of ZnO, for example.

Figure 4C:
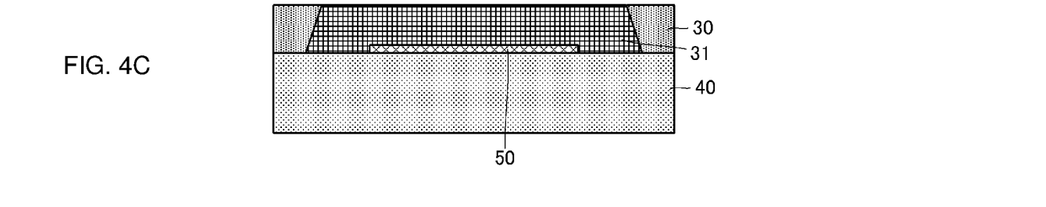

Next, as illustrated in FIG. 4C, the fixing layer 30 is formed on the surface of the support substrate 40. The fixing layer 30 is formed to cover the sacrificial layer 31, and then is formed by planarizing a step of the sacrificial layer 31. Note that, the fixing layer 30 in contact with the surface of the sacrificial layer 31 need not be entirely removed when planarizing.

Figure 4D:
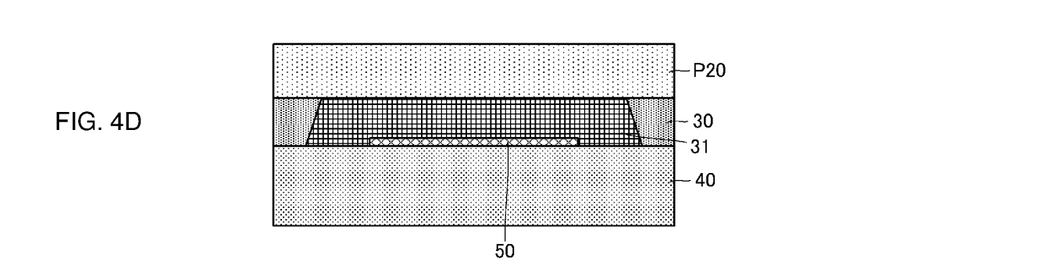
Figure 5A:
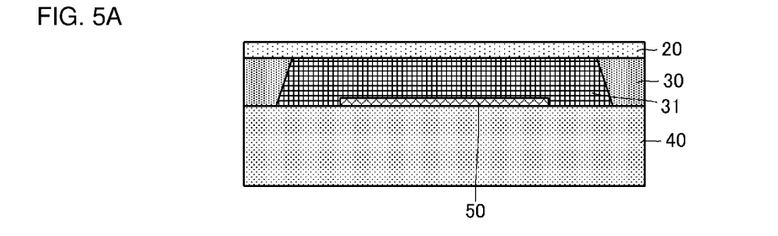
FIGS. 5A-5C are side sectional views illustrating shapes in respective processes in a method for manufacturing the piezoelectric module according to the first preferred embodiment of the present invention.

Subsequently, as illustrated in FIG. 4D, a piezoelectric substrate P20 is bonded to the planarized surface of the fixing layer 30 and the sacrificial layer 31. Then, as illustrated in FIG. 5A, the piezoelectric substrate P20 is thinned by polishing or the like to form the piezoelectric thin film 20.

Figure 5B:
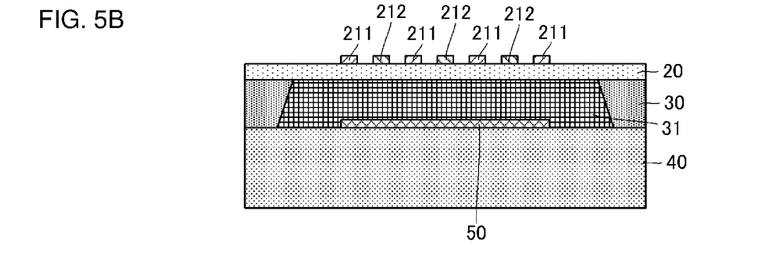

Next, as illustrated in FIG. 5B, the functional conductors 211 and 212 are formed on the piezoelectric thin film 20. At this time, although not illustrated in the drawing, the wiring conductors 221 and 222 are also formed on the piezoelectric thin film 20. Note that, the conductive via holes 240 are formed in the piezoelectric thin film 20 and the fixing layer 30 before the functional conductors 211 and 212 and the wiring conductors 221 and 222 are formed.

Figure 5C:
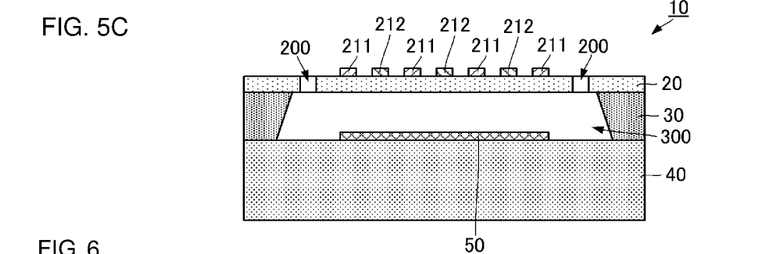

Next, as illustrated in FIG. 5C, the through-holes 200 are formed in the piezoelectric thin film 20. Then, the sacrificial layer 31 is removed through the through-holes 200. For example, the sacrificial layer 31 is preferably removed by wet etching. The void 300 is formed in the fixing layer 30 by this process.

With the above-described manufacturing method, the piezoelectric module 10 is formed.

Note that, although the present preferred embodiment describes a configuration in which the inductor is provided, an element having another circuit function such as, for example, a capacitor, a resistor, or the like may be provided. Furthermore, although the present preferred embodiment describes a configuration in which an element having a circuit function is provided by forming the conductor pattern on the surface of the support substrate 40, a mounting circuit element may alternatively be used instead. Note that, when the mounting circuit element is used, however, a conductor pattern that mounts the mounting circuit element and a bonding member that bonds the conductor pattern and the mounting circuit element are needed. Accordingly, with the configuration in which an element having the circuit function is provided by the conductor pattern, failure caused by mounting does not occur, and the mounting circuit element and the bonding member need not be additionally used.

Figure 6:
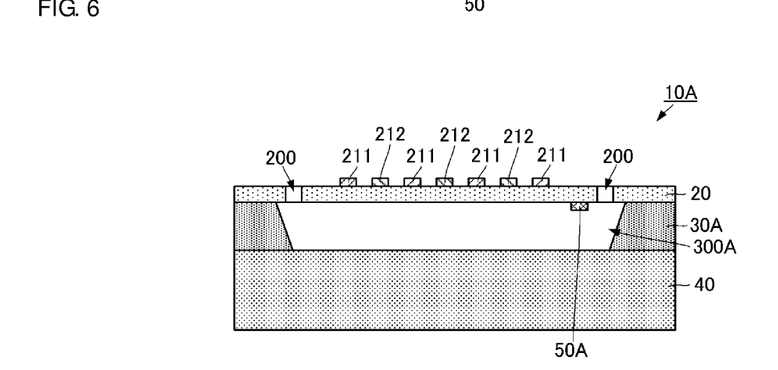
FIG. 6 is a side sectional view illustrating the configuration of a piezoelectric module according to a second preferred embodiment of the present invention.
Figure 7A:
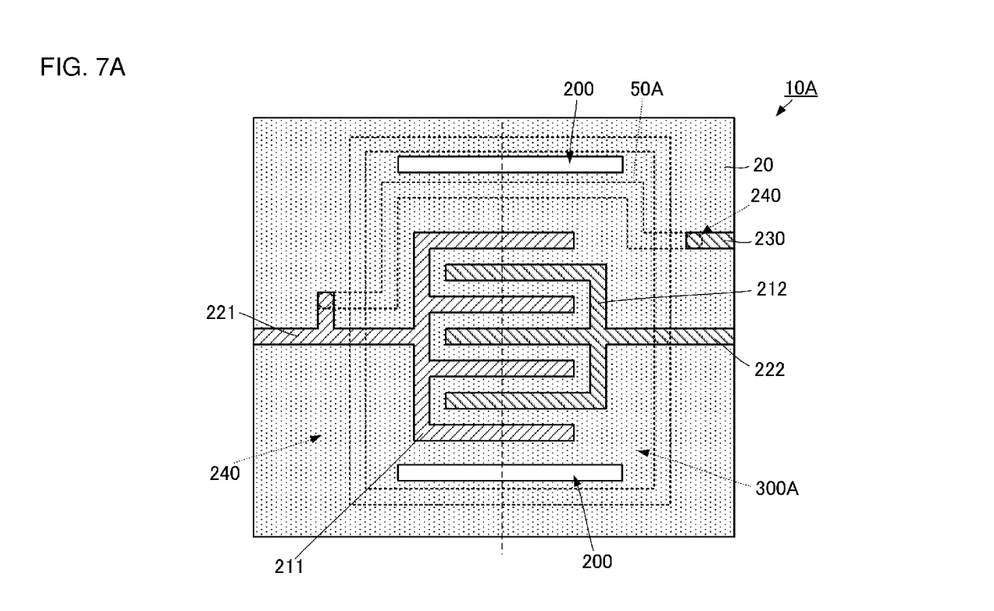
FIGS. 7A and 7B are plan views of a surface on which functional conductors are provided and a surface on which a circuit element is provided, of the piezoelectric module according to the second preferred embodiment of the present invention.
Figure 7B:
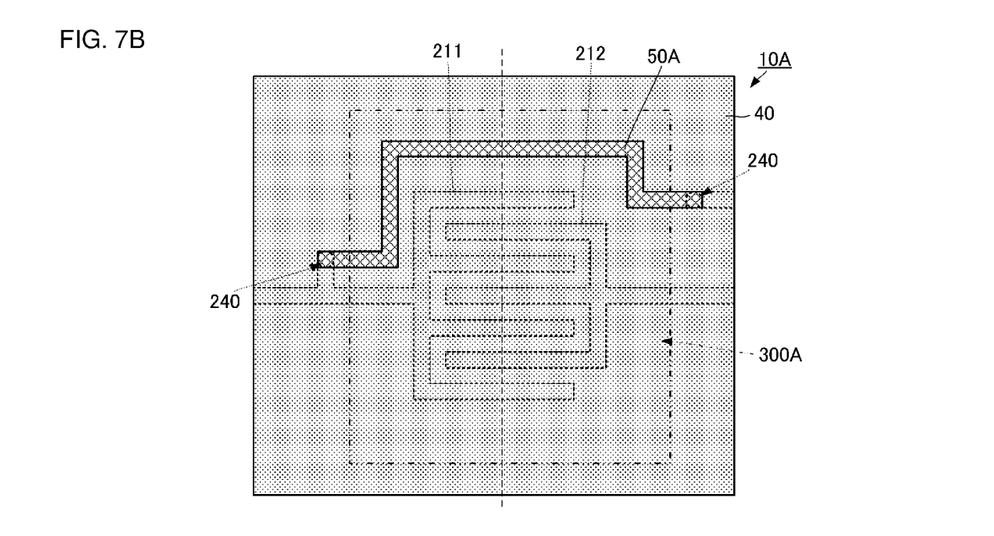

Next, a piezoelectric module according to a second preferred embodiment of the present invention will be described with reference to the drawings. FIG. 6 is a side sectional view illustrating the configuration of the piezoelectric module according to the second preferred embodiment of the present invention. FIG. 7A is a plan view of a surface, on which functional conductors are provided, of the piezoelectric module according to the second preferred embodiment of the present invention. FIG. 7B is a plan view of a surface, on which a circuit element is provided, of the piezoelectric module according to the second preferred embodiment of the present invention.

A piezoelectric module 10A according to the present preferred embodiment is different from the piezoelectric module 10 according to the first preferred embodiment with respect to the configurations of a conductor pattern 50A defining the circuit element and a void 300A. Further, the through-holes 200 may be defined by elongated slots which extend laterality adjacent to the conductor pattern 50A and the interdigital transducer region. The other configurations are preferably the same as those of the piezoelectric module 10 according to the first preferred embodiment.

The conductor pattern 50A is provided on the rear surface of the piezoelectric thin film 20. In plan view, the conductor pattern 50A overlaps with the void 300A excluding both ends in an extending direction. Additionally, in plan view, the conductor pattern 50A does not overlap with the interdigital transducer region.

According to this configuration, the piezoelectric module 10A according to the present preferred embodiment has high reliability and a small size similarly to the piezoelectric module 10.

The piezoelectric module 10A having such a configuration is preferably formed through processes described below. FIGS. 8A-8E are side sectional views illustrating shapes in respective processes in a method for manufacturing the piezoelectric module according to the second preferred embodiment of the present invention.

Figure 8A:
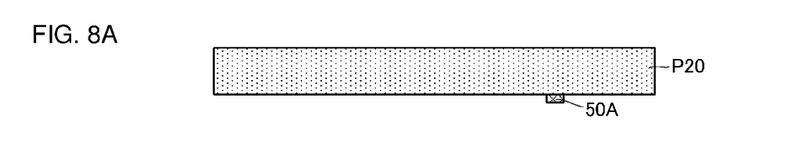
FIGS. 8A-8E are side sectional views illustrating shapes in respective processes in a method for manufacturing the piezoelectric module according to the second preferred embodiment of the present invention.
Figure 8B:
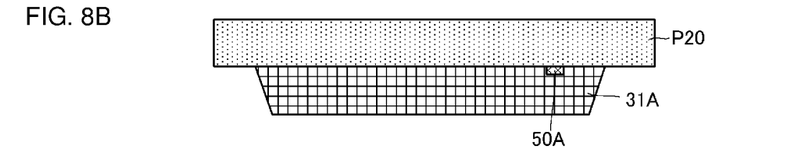

As illustrated in FIG. 8A, the conductor pattern 50A is formed on a rear surface of the piezoelectric substrate P20. Next, as illustrated in FIG. 8B, a sacrificial layer 31A is formed on the rear surface of the piezoelectric substrate P20. At this time, the sacrificial layer 31A is formed so as to cover a region excluding both ends of the conductor pattern 50A.

Figure 8C:
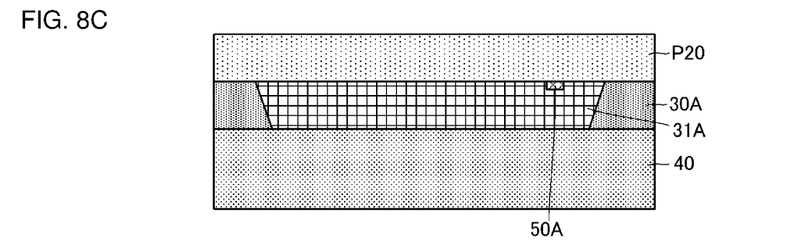

Next, as illustrated in FIG. 8C, a fixing layer 30A is formed, and the support substrate 40 is bonded to the fixing layer 30A and the sacrificial layer 31A.

Figure 8D:
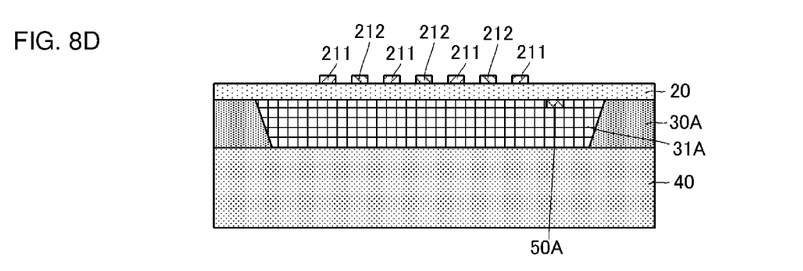

Then, as illustrated in FIG. 8D, the piezoelectric substrate P20 is thinned to form the piezoelectric thin film 20, and the functional conductors 211 and 212 are formed on the surface of the piezoelectric thin film 20.

Figure 8E:
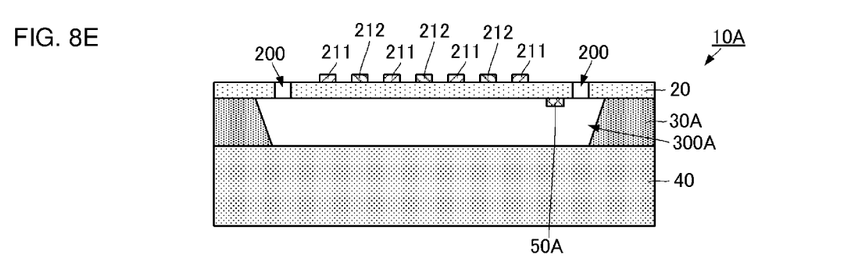

Next, as illustrated in FIG. 8E, the through-holes 200 are provided in the piezoelectric thin film 20, and the void 300A is provided by removing the sacrificial layer 31A.

Figure 9:
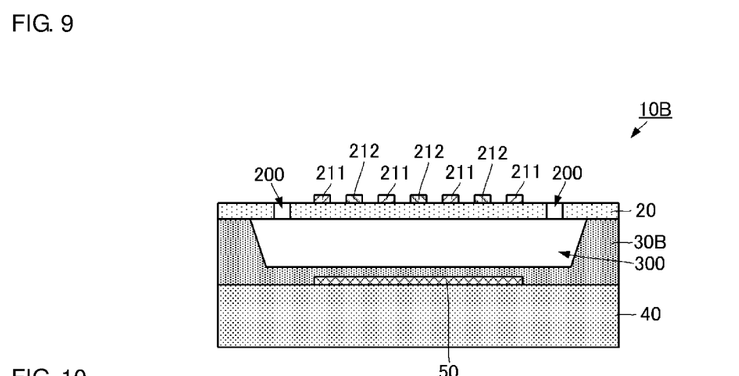
FIG. 9 is a side sectional view illustrating the configuration of a piezoelectric module according to a third preferred embodiment of the present invention.

Next, a piezoelectric module according to a third preferred embodiment of the present invention will be described with reference to the drawings. FIG. 9 is a side sectional view illustrating the configuration of the piezoelectric module according to the third preferred embodiment of the present invention.

A piezoelectric module 10B according to the present preferred embodiment is preferably different from the piezoelectric module 10 according to the first preferred embodiment in a shape of a fixing layer 30B. The fixing layer 30B is provided on the entire surface of the support substrate 40 to cover the conductor pattern 50. With this configuration as well, similarly to the piezoelectric module 10 according to the first preferred embodiment, the piezoelectric module 10B has high reliability and a small size.

Figure 10:
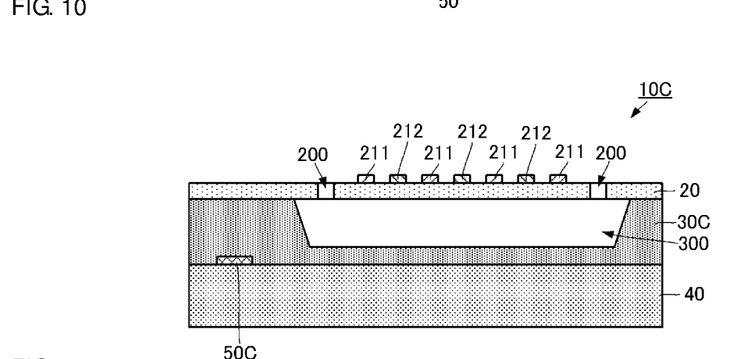
FIG. 10 is a side sectional view illustrating the configuration of a piezoelectric module according to a fourth preferred embodiment of the present invention.
Figure 11:
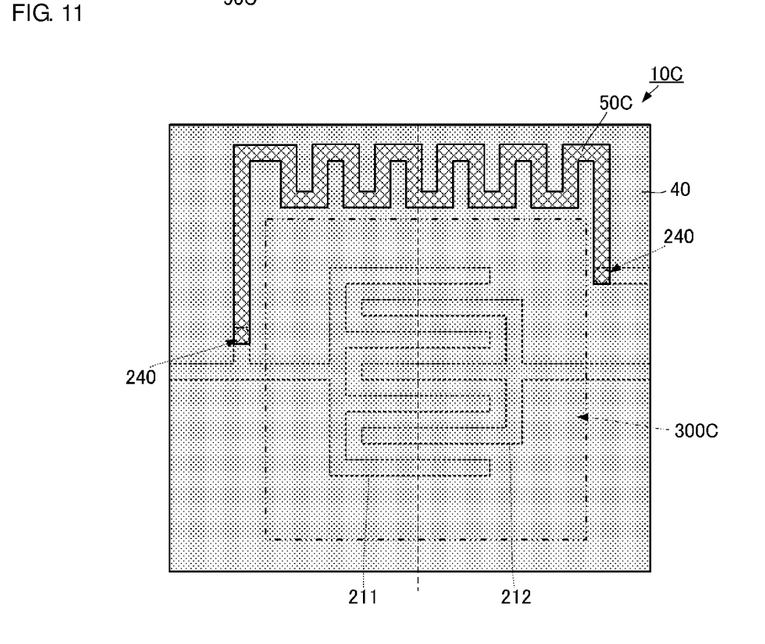
FIG. 11 is a plan view of a surface, on which a circuit element is provided, of the piezoelectric module according to the fourth preferred embodiment of the present invention.

Next, a piezoelectric module according to a fourth preferred embodiment of the present invention will be described with reference to the drawings. FIG. 10 is a side sectional view illustrating the configuration of the piezoelectric module according to the fourth preferred embodiment of the present invention. FIG. 11 is a plan view of a surface, on which a circuit element is provided, of the piezoelectric module according to the fourth preferred embodiment of the present invention.

A piezoelectric module 10C according to the present preferred embodiment is preferably different from the piezoelectric module 10B according to the third preferred embodiment in an arrangement position and a shape of a conductor pattern 50C defining the circuit element. The conductor pattern 50C is preferably entirely encapsulated within a fixing layer 30C at a position which does not overlap with the void 300. At this time, it is preferable that the conductor pattern 50C be close to the void 300 and have a shape substantially along an outer shape of the void 300. The conductor pattern 50C preferably has a meander shape.

With this configuration as well, similarly to the piezoelectric module 10B according to the third preferred embodiment, the piezoelectric module 10C has high reliability and a small size. With such a configuration, the conductor pattern 50C is able to be long, and thus it is possible to increase inductance while significantly reducing or preventing an increase in the piezoelectric module 10C area.

Figure 12:
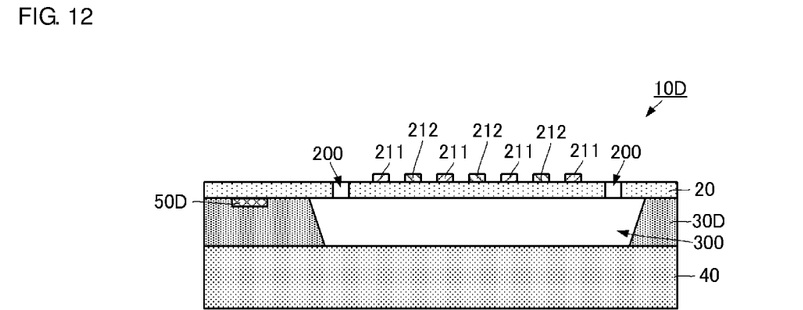
FIG. 12 is a side sectional view illustrating the configuration of a piezoelectric module according to a fifth preferred embodiment of the present invention.

Next, a piezoelectric module according to a fifth preferred embodiment of the present invention will be described with reference to the drawings. FIG. 12 is a side sectional view illustrating the configuration of the piezoelectric module according to the fifth preferred embodiment of the present invention.

A piezoelectric module 10D according to the present preferred embodiment is different from the piezoelectric module 100 according to the fourth preferred embodiment in an arrangement position of a conductor pattern 50D defining the circuit element. The conductor pattern 50D is provided on the rear surface of the piezoelectric thin film 20. With this configuration as well, similarly to the piezoelectric module 10C according to the fourth preferred embodiment, the piezoelectric module 10D has high reliability and a small size.

Figure 13:
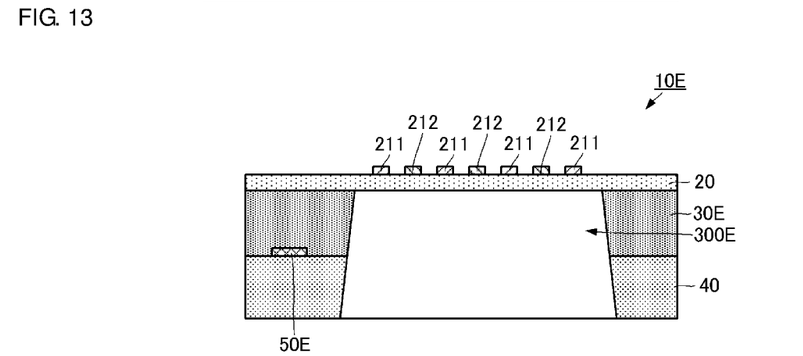
FIG. 13 is a side sectional view illustrating the configuration of a piezoelectric module according to a sixth preferred embodiment of the present invention.

Next, a piezoelectric module according to a sixth preferred embodiment of the present invention will be described with reference to the drawings. FIG. 13 is a side sectional view illustrating the configuration of the piezoelectric module according to the sixth preferred embodiment of the present invention.

A piezoelectric module 10E according to the present preferred embodiment is different from the piezoelectric module 10C according to the fourth preferred embodiment in a shape of a void 300E. The void 300E is preferably provided having a shape which passes through a fixing layer 30E and the support substrate 40. A conductor pattern 50E has the same configuration as that of the conductor pattern 50C. With this configuration as well, similarly to the piezoelectric module 10C according to the fourth preferred embodiment, the piezoelectric module 10E has high reliability and a small size. Additionally, it is possible to form the void without forming the sacrificial layer, and thus the piezoelectric module 10E is able to be formed with a simplified manufacturing process.

Figure 14:
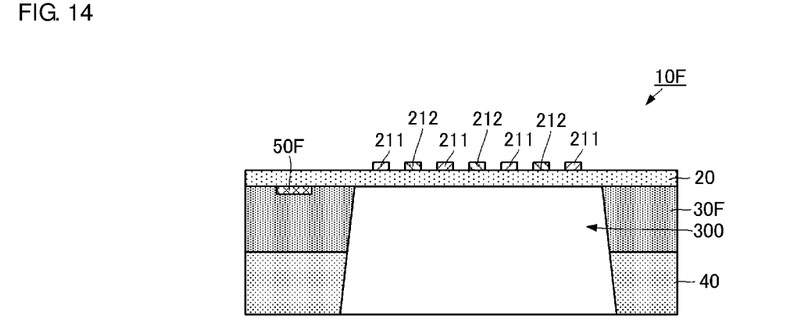
FIG. 14 is a side sectional view illustrating the configuration of a piezoelectric module according to a seventh preferred embodiment of the present invention.

Next, a piezoelectric module according to a seventh preferred embodiment of the present invention will be described with reference to the drawings. FIG. 14 is a side sectional view illustrating the configuration of the piezoelectric module according to the seventh preferred embodiment of the present invention.

A piezoelectric module 10F according to the present preferred embodiment is different from the piezoelectric module 10E according to the sixth preferred embodiment in an arrangement position of a conductor pattern 50F defining the circuit element. The conductor pattern 50F is provided on the rear surface of the piezoelectric thin film 20. With this configuration as well, similarly to the piezoelectric module 10E according to the sixth preferred embodiment, the piezoelectric module 10F has high reliability and a small size.

Figure 15:
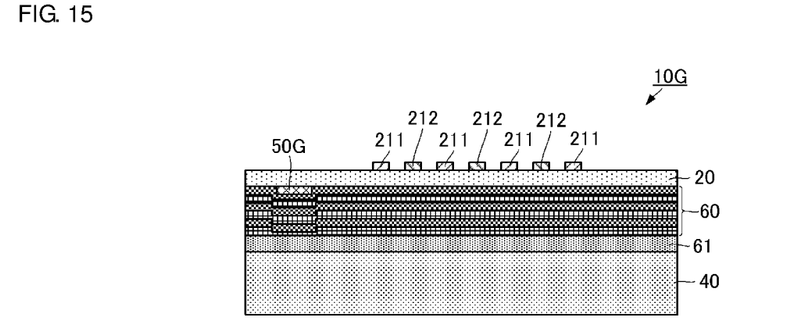
FIG. 15 is a side sectional view illustrating the configuration of a piezoelectric module according to an eighth preferred embodiment of the present invention.

Next, a piezoelectric module according to an eighth preferred embodiment of the present invention will be described with reference to the drawings. FIG. 15 is a side sectional view illustrating the configuration of the piezoelectric module according to the eighth preferred embodiment of the present invention.

A piezoelectric module 10G according to the present preferred embodiment is different from the piezoelectric module 10D according to the fifth preferred embodiment in a point that the fixing layer 30 is preferably provided by an acoustic reflection layer 60.

The acoustic reflection layer 60 is preferably formed by laminating a plurality of layers having different acoustic impedances. A low acoustic impedance layer is preferably, for example, made of $SiO_2$, a high acoustic impedance layer is preferably, for example, made of a metal such as W or the like, or a dielectric such as AlN, SiN, or the like. The acoustic reflection layer 60 is preferably bonded to the support substrate 40 using an adhesive layer 61.

With this configuration as well, similarly to the piezoelectric module 10D according to the fifth preferred embodiment, the piezoelectric module 10G has high reliability and a small size.

Note that, the conductor pattern 50G may be provided on or in any layer defining the acoustic reflection layer 60.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A piezoelectric module comprising:
a piezoelectric thin film including a front surface and a rear surface;
a functional conductor provided on the front surface of the piezoelectric thin film;
a support substrate provided on the rear surface side of the piezoelectric thin film;
a fixing layer fixing the piezoelectric thin film to the support substrate;
a circuit element between the piezoelectric thin film and the support substrate;
at least one conductive via hole passing through the fixing layer and the piezoelectric thin film in a thickness direction;
a wiring conductor provided on the front surface and connected to the functional conductor and the at least one conductive via hole; and
a void surrounded by the piezoelectric thin film, the fixing layer, and the support substrate; wherein
the circuit element includes a conductor pattern that defines and functions as an inductor;
the conductor pattern that defines and functions as the inductor is disposed in the void; and
both ends of the conductor pattern are connected to the at least one conductive via hole.

2. The piezoelectric module according to claim 1, wherein the conductor pattern is provided on the piezoelectric thin film or the support substrate.

3. The piezoelectric module according to claim 1, wherein
the piezoelectric module further includes a resonator electrode provided on the front surface of the piezoelectric thin film; and
when viewed in a direction perpendicular or substantially perpendicular to the front surface of the piezoelectric thin film, the fixing layer includes the void, and the void includes a region in which the functional conductor is provided.

4. The piezoelectric module according to claim 3, wherein the conductor pattern overlaps with the void.

5. The piezoelectric module according to claim 4, wherein a region in which the conductor pattern is provided overlaps with the region in which the functional conductor is provided.

6. The piezoelectric module according to claim 5, wherein the region in which the conductor pattern is provided entirely overlaps with the region in which the functional conductor is provided.

7. The piezoelectric module according to claim 3, further comprising:
at least one through-hole provided in the piezoelectric thin film, the at least one through-hole communicating the void to an outside of the piezoelectric module.

8. The piezoelectric module according to claim 2, wherein the conductor pattern has a meandering or serpentine shape.

9. The piezoelectric module according to claim 4, wherein the conductor pattern has a meandering or serpentine shape.

10. The piezoelectric module according to claim 1, wherein the functional conductor includes two functional conductors which have comb-teeth shapes in plan view.

11. The piezoelectric module according to claim 5, wherein the functional conductor includes two functional conductors which have comb-teeth shapes in plan view.

12. The piezoelectric module according to claim 4, wherein
the conductor pattern does not overlap with the functional conductor; and
the functional conductor includes two functional conductors which have comb-teeth shapes in plan view.

13. The piezoelectric module according to claim 7, wherein the at least one through-hole is defined by at least one elongated slot which extend laterally in the piezoelectric thin film.

14. The piezoelectric module according to claim 7, wherein the at least one through-hole is defined by at least one elongated slot which extend laterally adjacent to one or more of the conductor pattern and the functional conductor.

15. The piezoelectric module according to claim 1, wherein
the circuit element is provided on a front surface of the support substrate.

16. The piezoelectric module according to claim 1, wherein
the circuit element is provided on the rear surface of the piezoelectric thin film.

17. The piezoelectric module according to claim 12, wherein
the circuit element is provided on the rear surface of the piezoelectric thin film.

18. The piezoelectric module according to claim 3, wherein
the conductor pattern has a meandering or serpentine shape.

* * * * *